United States Patent [19]
Brouant

[11] 3,944,938
[45] Mar. 16, 1976

[54] PHASE CORRELATOR

[75] Inventor: Michel Brouant, Boulogne, France

[73] Assignee: Compagnie Industrielle Des Telecommunications Cit-Alcatel, France

[22] Filed: Aug. 16, 1974

[21] Appl. No.: 498,111

[30] Foreign Application Priority Data
Aug. 16, 1973  France .............................. 73.29879

[52] U.S. Cl. ............... 329/50; 324/83 FE; 328/134; 329/136
[51] Int. Cl.² .......................................... H03D 3/06
[58] Field of Search ...... 329/50, 136, 112; 328/133, 328/134; 324/82, 83 R, 83 A, 83 FE

[56] References Cited
UNITED STATES PATENTS

| | | | |
|---|---|---|---|
| 3,001,133 | 9/1961 | Boscia | 324/83 A |
| 3,083,340 | 3/1963 | Nelson | 324/82 X |
| 3,109,143 | 10/1963 | Gluth | 329/50 X |
| 3,122,704 | 2/1964 | Jones | 329/50 X |

Primary Examiner—Siegfried H. Grimm
Attorney, Agent, or Firm—Craig & Antonelli

[57] ABSTRACT

Phase correlator between a wave having a frequency of F sent out by an oscillator and a useful signal having the same frequency F and having a relative phase $\phi_0$, comprising a first and a second modulator effecting the modulation of the useful signal having a high noise level by the wave out by the oscillator on the one hand through an adjustable phase-shifter of $\phi$ and on the other hand through the phase-shifter of $\phi$ followed by a fixed phase-shifter of $\phi_1$, an adjusting circuit of $\phi$ by the error signal between the two preceding modulation signals coming respectively from two integrators and a third modulator effecting the modulation of the signal having a high noise level by the wave sent out by the oscillator through another phase-shifter of $\phi1/2$ connected with the phase-shifter.

4 Claims, 1 Drawing Figure

U.S. Patent  March 16, 1976  3,944,938
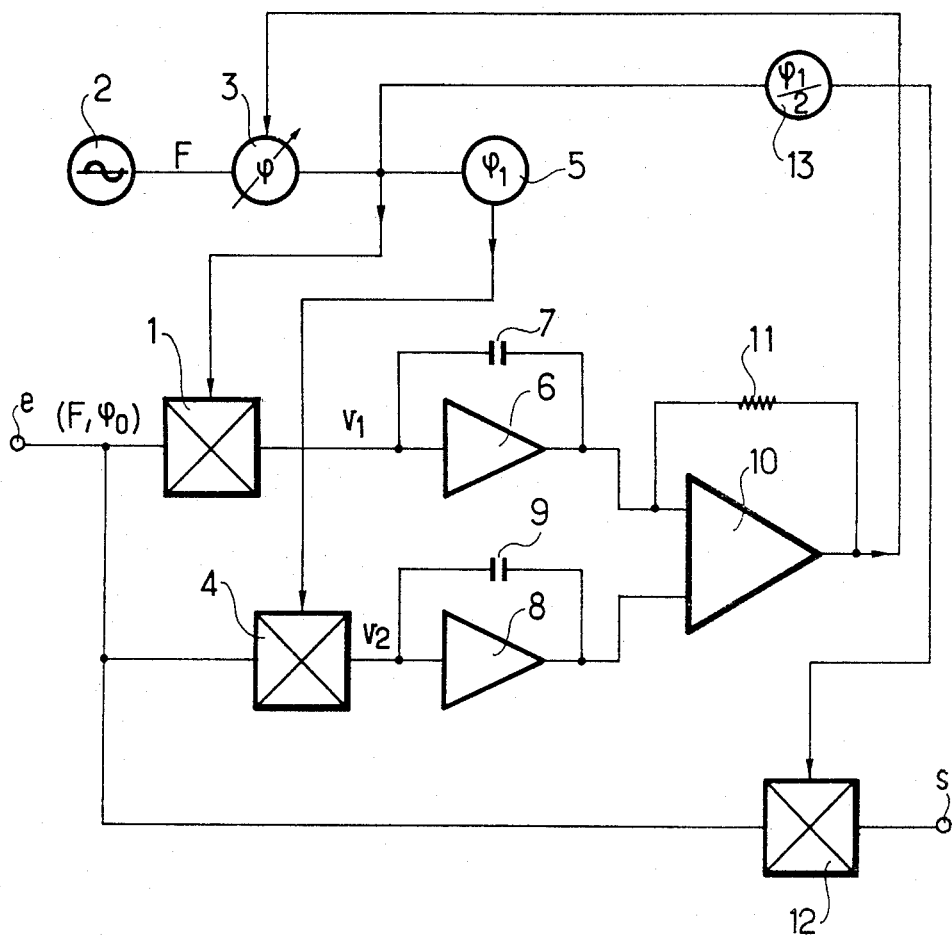

PHASE CORRELATOR

The present invention relates to synchronous detectors. It has as its object the placing into phase of a carrier signal with a signal to be detected.

The conventional phase-detectors used for reproducing the frequency F and the phase $\phi$ of a sinusoidal signal are phase-locked loop systems in which a free oscillator with frequency close to F is controlled by an error signal which represents the phase difference between said sinusoidal signal and the oscillator output signal.

It is a known method, in the case where the sinusoidal signal is accompanied by an interference signal or background noise, to effect a filtering operation in a band having a slight width to reduce the interference signal with a view to limiting its influence in the loop for measuring the phase difference, it being necessary for the interference signal to be at a very low level in relation to that of the sinusoidal signal.

When there is a high-level noise, that solution leads to the use of a band-pass filter having a narrow band, that band being all the more narrow as the noise level is higher.

That solution therefore has limited uses. This is more particularly the case with telephonic transmissions by submarine cables when it is required to check the non-linearity of the repeaters equipping the line. It is known that this checking is effected by synchronous detection and measuring of the intermodulation signal generated from a measuring wave sent out by the emitting terminal station and from a wave injected in one of the repeaters by a local source. That intermodulation signal received from the repeater considered in the receiving terminal station is applied, after filtering, in a band having a width of 200 c/s, with a signal to noise ratio (useful signal/noise due to the line) in the order of −20 to −30 dB.

Thus, to reduce practically the influence of the noise signal on the useful signal, it is required, in the conventional synchronous detection solution, to effect a filtering of the intermodulation signal in a very narrow band, it then becoming impossible to produce the suitable filter.

The aim of the present invention is, more particularly, to overcome the disadvantages and the limits of that known solution.

It has for its object a phase correlator between a wave having a frequency of F sent out by an oscillator and a useful signal, having the same frequency F and a relative phase $\phi_0$, and having a high noise level, called the input signal, characterized in that it comprises a modulator ensuring the modulation of the input signal by the wave sent out by the oscillator through an adjustable phase-shifter of $\phi$ and a fixed phase-shifter of $\phi_1/2$, and a control circuit for controlling the adjustable phase-shifter of $\phi$ generating a control signal which is a function of the difference between two signals generated by modulation of the said input signal respectively by two waves with a phase difference of $\phi_1$ coming from the oscillator followed by the adjustable phase shift.

Other characteristics and the advantages of the present invention will become apparent from the description of a preferred embodiment shown in the single figure of the accompanying drawing.

The phase correlator for a sinusoidal signal, having a frequency F and a phase $\phi_0$, which may be accompanied by a noise B, called the input signal $e$, comprises a first modulator 1 receiving that signal $e$ and ensuring its modulation by a carrier, having the same frequency F and an adjustable phase $\phi$, sent out by an oscillator 2 through an adjustable phase-shifter 3 of $\phi$, of a type known per se, and a second modulator 4 receiving the signal $e$ and ensuring its modulation by the aforementioned carrier whose frequency is F and whose phase is $\phi$, having undergone a further fixed phase shift of $\phi_1$ in a phase shifter 5.

The output signal of the modulator 1 is applied to a first integrator circuit having an operational amplifier 6 and an integration capacitor 7, whereas the output signal of the modulator 4 is applied to a second integrator circuit having an operational amplifier 8 and an integration capacitor 9.

The two integration signals, at the output of the integrators 6 – 7 and 8 – 9 are applied respectively to the two inputs of an operational amplifier 10 connected up as a differential unit and with negative feedback resistance 11. The difference between these two integration signals, obtained after a time determined by the time constant of the integrator circuits, ensures the control of the adjusting of the phase $\phi$ brought in by the adjustable phase-shifter 3, making these two integration signals equal. A third modulator 12 receiving the input signal ensures its modulation by the carrier having a frequency of F and a phase of $\phi$ previously adjusted, through another shifter 13 having a fixed phase shift of $\phi_1/2$.

The signals coming from the modulator 12 correspond to the input signal detected by a carrier having the same phase.

In this device, the input signal $e$, such as $e = B + v_0 \cos(wt + \phi_0)$ where B is an interference signal or noise and $v_0 \cos(wt + \phi_0)$ is a useful signal having an amplitude of $v_0$ with a frequency of $F = \omega/2\pi$ and with a phase of $\phi_0$ in relation to the wave having the same frequency sent out by the oscillator, becomes:

$$v1 = k\, v_0 \cos(\phi_0 - \phi) + kB',$$

at the output of the modulator 1 after modulation by the carrier whose frequency is F and whose phase is $\phi$, and $$v2 = \phi - v_0 \cos(\phi_0 - \phi - \phi_1) + kB'',$$ at the output of the modulator 4 after modulation by the carrier having a frequency of F and a phase of $\phi + \phi 1$, $k$ being the coefficient of amplification due to the modulations, $kB'$ and $kB''$ being the components of the noise after modulation.

The measuring of the deviation between the signals $v1$ and $v2$ measured by the differential amplifier 10, connected to the outputs of the integrators 6 – 7 and 8 – 9, receiving respectively the signals $v1$ and $v2$, ensures the adjusting of the phase $\phi$ by servo-control means to make these signals just about equal.

At the output of the differential amplifier 10, having a gain of G, a control signal for the phase-shifter 3 having a value C is generated:

$$C = G\,[k'v_0 \cos(\phi_0 - \phi - \phi_1) + b'' - k'\, v_0 \cos(\phi_0 - \phi) - b'],$$

$b'$ and $b''$ being the residues of noise at the output of the integrators 6, 7 and 8, 9, $k'$ being the coefficient affecting the signals at the output of the amplifier 10.

That signal controls the phase shifter 3 according to a relation: $\phi = C/a$, $a$ being a parameter of connection between $C$ and $\phi$.

Applying the trigonometric formula giving the difference of the cosines of two angles, the relation deduced is:

$$\sin\left(\Phi_0 - \Phi - \frac{\Phi_1}{2}\right) = \frac{a\Phi}{2k'v_0 G \sin\frac{\Phi_1}{2}} + \frac{b' - b''}{2k'v_0 \sin\frac{\Phi_1}{2}}$$

if $\phi_1$ No. 0, if $b'$ and $b''$ are sufficiently small and G is sufficiently great, the result obtained is:

$\sin(\phi_0 - \phi - \phi_1/2)$ approaches 0 this leading to:

$$\phi = \phi_0 - \phi_1/2 \qquad (1)$$

In practice, the value $\pi/2$ will preferably be chosen for $\phi_1$.

The signal $e$ modulated by the carrier having a frequency of F and a phase of $(\phi + \phi_1/2)$ becomes, at the output of the modulator 12:

$s = kB1 + k\ v_0 \cos(\phi_0 - \phi - \phi_1/2)$, $kB1$ being the component of the noise after modulation, that is:

$s = kB1 + k\ v_0$, taking into account the equation (1).

Due to the differential structure of the circuitry according to the invention, the adjusting of the phase shift $\phi$ to the required synchronism is very rapidly obtained, despite the relatively high values of the time constants of the integrators 6 – 7 and 8 – 9.

The present invention has been described with reference to a preferred embodiment shown in the drawing; it is evident that details may be modified and/or that certain means may be replaced therein by other equivalent means.

I claim:

1. A phase correlator for correlating the phase between a predetermined signal and a useful signal of an input signal, said predetermined signal and said useful signal having a same frequency F and a relative phase $\phi_0$, said phase correlator comprising:

signal generating means for generating said predetermined signal, an adjustable phase-shifter for applying an adjustable phase shift $\phi$ to said predetermined signal, and a fixed phase-shifter for applying a fixed phase $\phi_1/2$ different from zero to said predetermined signal, control circuit means for controlling the value of $\phi$ including first and second modulators, said input signal being applied to the input of each of first and second modulators, said first modulator modulating said input signal by said predetermined signal sent out through said adjustable phase-shifter of $\phi$, and said second modulator modulating said input signal by said predetermined signal sent out through both said adjustable phase-shifter of $\phi$ and a second fixed phase-shifter of $\phi_1$, and comparator circuit means between the output signals from said first and second modulators for controlling the value of $\phi$, and modulation means for modulating said input signal by said predetermined signal sent out through said adjustable phase-shifter of $\phi$ and said fixed phase-shifter of $\phi_1/2$.

2. A phase correlator according to claim 1, wherein said control circuit means further includes first and second integrator circuits, said first and second integrator circuits receiving respectively the output signals from said first and second modulators, and wherein said comparator circuit means includes a differential amplifier means for providing a control signal for controlling said adjustable phase-shifter of $\phi$, said differential amplifier means receiving the respective output signals of said first and second integrator circuits.

3. A phase correlator according to claim 2, wherein adjustable phase $\phi$ is controlled so that $\phi_0 - \phi = \phi_1/2$.

4. A phase correlator according to claim 2, wherein the second phase shift $\phi_1$ is $\pi/2$.

* * * * *